United States Patent [19]

Huijsing et al.

[11] Patent Number: 5,109,170
[45] Date of Patent: Apr. 28, 1992

[54] CURRENT COMPENSATION CIRCUIT

[75] Inventors: Johan H. Huijsing, Schipluiden; Maarten J. Fonderie, Delft, both of Netherlands

[73] Assignee: U.S. Philips Corp., New York, N.Y.

[21] Appl. No.: 655,569

[22] Filed: Feb. 12, 1991

[30] Foreign Application Priority Data

Feb. 14, 1990 [NL] Netherlands ................. 9000351

[51] Int. Cl.$^5$ .................................................. G06G 7/12
[52] U.S. Cl. ......................... 307/491; 307/264; 307/494; 330/288
[58] Field of Search .......... 307/264, 490, 491, 493, 307/494; 330/288, 294

[56] References Cited

U.S. PATENT DOCUMENTS

| | | | |
|---|---|---|---|
| 4,015,215 | 3/1977 | Seki | 330/297 |
| 4,453,092 | 6/1984 | Joseph | 330/288 |
| 4,481,481 | 11/1984 | Sleeth | 330/296 |
| 4,568,840 | 2/1986 | Kenji | 307/264 |
| 4,758,796 | 7/1988 | Verhoeven | 330/260 |

*Primary Examiner*—Eugene R. Laroche
*Assistant Examiner*—A. Zarabian
*Attorney, Agent, or Firm*—Bernard Franzblau

[57] ABSTRACT

An electronic current compensation circuit which includes a series connections of a load (L) and a first control current source (3) and also includes a current follower (7). A second control current source (6) identical to the first control current source is connected to the input (8) and the first output (9) of the current follower. A second output of the current follower is connected to the junction (4) of the load and the first control current source to compensate for the load current ($i_L$).

30 Claims, 8 Drawing Sheets

CURRENT COMPENSATION CIRCUIT

BACKGROUND OF THE INVENTION

This invention relates to an electronic circuit comprising a series connection of a load and a first control current source, inserted between first and second supply terminals, for producing a first current, the load and the control current source being connected to a first control terminal.

A circuit of this type is widely known. The load may be, for example, a resistor, a diode, a pilot lamp or an amplifier stage, whereas the first control current source may be embodied in a control transistor or an amplifier control stage. The first current of the first control current source is to be adapted to the current need of the load. If the first current is inadequate, additional amplifier means are to be inserted between the first control current source and the load. This manner of amplification is disadvantageous in that signal deterioration occurs in the signal transfer from the first control current source and the load, for example, due to high-frequency signal loss or phase shift in the amplifier means inserted between the first control current source and the load.

SUMMARY OF THE INVENTION

It is an object of the invention to provide an electronic circuit in which, without amplifier means inserted between the first control current source and the load, the first current of the first control current source is transferred in an amplified version to the load.

According to the invention an electronic circuit of the type set forth in the preamble is characterized in that the electronic circuit further includes a second control current source for producing a second current that is substantially equal to the first current, a second control terminal connected to the second control current source and to a current follower having a current follower input for receiving a current to be followed and having first and second current follower outputs for delivering currents that are proportional to the current to be followed, the current follower input and the first current follower output being coupled to the second control terminal and the second current follower output being coupled to the first control terminal.

The second current follower output delivers to the first control terminal a current that is a multiple of the first current of the first control current source. This current flows into the load connected to the first control terminal and compensates for the necessary load current. Consequently, the first control current source is loaded much less. The direct link between the load and the first control current source is maintained so that signal deterioration between the first control current source and the load cannot occur.

The current following function can be realized in the current follower in an embodiment in which the current follower comprises first and second current mirror circuits each having a current input for connecting a current to be mirrored and a common current terminal for connecting a supply current. The first current mirror circuit has a current output and the second current mirror circuit has first and second current outputs for delivering currents proportional to the current to be mirrored and flowing in the same direction, the current input of the first current mirror circuit being coupled to the current follower input. The current output of the first current mirror circuit is coupled to the current input of the second current mirror circuit and the first and second current outputs of the second current mirror circuit are coupled to the first and second current follower outputs respectively.

The first current mirror circuit has a single current output, the second current mirror circuit has two. By connecting the current output of the first current mirror circuit to the current input of the second current mirror circuit, two currents are available that flow in the same direction as the input current of the first current mirror circuit.

In a further embodiment the current mirror circuits are characterized in that the first current mirror circuit comprises first and second transistors of a same conductivity type, each having a base, an emitter and a collector, whose base-emitter junctions are connected in parallel, their emitters being connected to the common current terminal of the first current mirror circuit and their collectors being coupled to the respective current input and current output of the first current mirror circuit, and in that the second current mirror circuit comprises third, fourth and fifth transistors of a same conductivity type, each having a base, an emitter and a collector, the base-emitter junctions of these third, fourth and fifth transistors being connected in parallel, their emitters being connected to the common current terminal of the second current mirror circuit and their collectors being coupled to the current input, the first current output and the second current output respectively, of the second current mirror circuit.

This basic embodiment of the current mirror circuit may be refined and adjusted to the type of load. A first refined embodiment is characterized in that the conductivity type of the third, fourth and fifth transistors is opposite to the conductivity type of the first and second transistors and in that the electronic circuit further includes sixth, seventh, eighth and ninth transistors of the same conductivity type as that of the first and second transistors and tenth, eleventh and twelfth transistors of a conductivity type equal to that of the third, fourth and fifth transistors, all having a base, an emitter and a collector, whereas the collectors of the first and second transistors are connected to the emitters of the respective sixth and seventh transistors respectively, the bases of the sixth and seventh transistors are interconnected, the collector of the sixth transistor is connected to the base of the first transistor and to the current input of the first current mirror circuit, the collector of the seventh transistor is connected to the base of the seventh transistor and to the current output of the first current mirror circuit, the emitters of the eighth and ninth transistors are connected to the emitter of the seventh transistor, their bases to a reference voltage source, and the collector of the eighth transistor is coupled to the base of the third transistor and the collector of the ninth transistor is coupled to the collector and the base of the tenth transistor whose base-emitter junction is connected in parallel to the base-emitter junctions of the eleventh and twelfth transistors, the emitters of the tenth, eleventh and twelfth transistors are connected to the common current terminal of the second current mirror circuit, and the collectors of the respective eleventh and twelfth transistors are coupled to the respective first and second current outputs of the second current mirror circuit.

This current follower is extremely suitable if PNP transistors are selected for the first current mirror circuit and NPN transistors are selected for the second current mirror circuit.

A second refined embodiment is characterized in that the electronic circuit further includes a thirteenth transistor of a conductivity type opposite to that of the third transistor and having a base, emitter and collector connected to a reference voltage source, the collector of the third transistor and the base of the third transistor respectively.

This current follower is extremely suitable if NPN transistors are selected for the first current mirror circuit and PNP transistors are selected for the second current mirror circuit.

Driving the electronic circuit at the first and second control terminals is effected by means of two control current sources which, according to an embodiment, may be characterized in that the first and second control current sources are arranged as fourteenth and fifteenth transistors respectively of a first conductivity type, each having a base, emitter and a collector, their bases being connected to a first input terminal and the emitters to a common junction, and the collectors of the fourteenth and fifteenth transistors being coupled to the first and second control terminals respectively.

By the matching of the fourteenth and fifteenth transistors, a good similarity of the two control current sources can be achieved.

The load may be selected to be a transistor. In that case the electronic circuit may be characterized in that the electronic circuit further includes a sixteenth transistor having a base, emitter and a collector, whose base is connected to the first control terminal and of which a main current path formed by the emitter and the collector is connected to an output terminal.

The sixteenth transistor operates as the output transistor of an amplifier stage having an input terminal, an output terminal and two supply terminals. In this stage the sixteenth transistor may be a PNP transistor, in which case the electronic circuit in a preferred embodiment may be characterized in that the sixteenth transistor is of a second conductivity type opposite to the first conductivity type, the emitter and the collector of the sixteenth transistor being coupled to the respective first supply terminal and the output terminal, in that the first and second transistors are of the second conductivity type and the third, fourth and fifth transistors are of the first conductivity type and in that the common terminals of the first and second current mirror circuits are connected to the first and second supply terminals respectively.

In this case the second current mirror circuit is arranged to comprise transistors of a conductivity type opposite to that of the sixteenth transistor so that a large base current may be supplied to the sixteenth transistor without additional bias current sources. A circuit of this type still operates properly with a supply voltage of a mere 1 volt across the first and second supply terminals.

When selecting an NPN transistor for the sixteenth transistor, in a preferred embodiment the electronic circuit may be characterized in that the sixteenth transistor is of the first conductivity type, the emitter and the collector of the sixteenth transistor being coupled to the output terminal and the first supply terminal respectively, in that the first and second transistors are of the first conductivity type and the third, fourth and fifth transistors of a second conductivity type opposite to the first conductivity type, and in that the common terminals of the first and second current mirror circuits are connected to the output terminal and the first supply terminal respectively.

In this case the sixteenth transistor is arranged as an emitter follower. Also in this case the transistors of the second current mirror circuit are selected to be of a conductivity type adapted to the base current of the sixteenth transistor.

The sixteenth transistor may also be incorporated in a common-emitter circuit. In that case the electronic circuit may be characterized in that the sixteenth transistor is of the first conductivity type, the emitter and the collector of the sixteenth transistor being coupled to the second supply terminal and the output terminal respectively, in that the first and second transistors are of the first conductivity type and the third, fourth and fifth transistors of a second conductivity type opposite to the first conductivity type, and in that the common terminals of the first and second current mirror circuits are connected to the second and first supply terminals respectively.

In lieu of an asymmetric drive on a single input terminal, a symmetric drive is likewise possible by means of a differential input. An extremely suitable embodiment of this is characterized in that the electronic circuit further includes a first bias current source inserted between the common junction and the second supply terminal, seventeenth and eighteenth transistors of the first conductivity type each having a base, emitter and a collector, whose bases are connected to a second input terminal and their emitters to the common junction; nineteenth, twentieth, twenty-first and twenty-second transistors of the second conductivity type each having a base, emitter and a collector, whose base-emitter junctions are connected in parallel and whose emitters are connected to the first supply terminal and whose collectors are coupled to the collectors of the eighteenth, seventeenth, fourteenth and fifteenth transistors respectively.

This embodiment is extremely suitable in combination with the afore-mentioned embodiments comprising a sixteenth transistor of the PNP type if it is further characterized in that the base of the nineteenth transistor is connected to the collector of the nineteenth transistor and in that the electronic circuit further includes twenty-third, twenty-fourth and twenty-fifth transistors o the second conductivity type, each having a base, emitter and a collector, whose base-emitter junctions are connected in parallel, whose emitters are connected to the first supply terminal and whose bases are coupled to the collector of the seventeenth transistor, and whose collectors are coupled to the collectors of the seventeenth, fourteenth and fifteenth transistors, respectively.

When using a sixteenth transistor of the NPN type, an extremely suitable embodiment is obtained if the electronic circuit further includes a twenty-sixth transistor of the second conductivity type having a base, emitter and a collector, whose base-emitter junction is connected in parallel to the base-emitter junctions of the nineteenth to twenty-second transistors and whose base and collector are interconnected and coupled to the first supply terminal via a second bias current source, and twenty-seventh to thirtieth transistors of the first conductivity type each having a base, emitter and a collector, whose bases are connected to the collector of the seventeenth transistor, their emitters to the second supply terminal and whose collectors are connected to the collectors of the eighteenth, seventeenth, fourteenth and fifteenth transistors respectively, and the collector of the eighteenth transistor being interconnected to the collector of the seventeenth transistor.

In both cases the differential input stage is fully symmetrical and balanced which benefits the offset reduction between the first and second input terminals.

In the case of a differential drive, it is possible to include the first and second current mirror circuits in the differential input stage so that a considerable component reduction is possible. A first embodiment of this is characterized in that the first and second control current sources are constituted by sixth and seventh transistors respectively, of a first conductivity type, each having a base, emitter and a collector, the bases being connected to a first input terminal and the emitters to a common junction, which junction is coupled to the second supply terminal via a bias current source, and the collectors of the sixth and seventh transistors being coupled to the first and second control terminals respectively, in that the common terminals of the first and second current mirror circuits are connected to the first supply terminal, in that the first to fifth transistors are of a second conductivity type opposite to the first conductivity type and the base-collector junctions of the first and third transistors are short-circuited, and in that the electronic circuit further includes an eighth transistor of the first conductivity type having a base, emitter and a collector connected to a second input terminal, the common junction and the current input of the second current mirror circuit respectively. A fully symmetrical very suitable embodiment comprising a PNP transistor as a load may further be characterized in that the electronic circuit further includes a ninth transistor of the first conductivity type and tenth to twelfth transistors of the second conductivity type, all having a base, emitter and a collector, the base and the emitter of the ninth transistor being connected to the second input terminal and the common junction respectively, and the collector of the ninth transistor being connected to the collector of the tenth transistor, whose base-emitter junction is connected in parallel to that of the third transistor, and is also connected to the bases of the eleventh, twelfth and thirteenth transistors, the emitters of these eleventh to thirteenth transistors being connected to the first supply terminal and their collectors being connected to the collector of the ninth transistor, the second control terminal and the first control terminal respectively.

An embodiment extremely suitable for use where the load is an NPN transistor arranged as an emitter-follower, may further be characterized in that the first and second control current sources are constituted by sixth and seventh transistors respectively, of a first conductivity type, each having a base, emitter and a collector, the bases being connected to a first input terminal and the emitters to a common junction, which junction is coupled to a second supply terminal via a bias current source, and the collectors being coupled to the first and second control terminals respectively, in that the common terminals of the first and second current mirror circuits are connected to the common junction and the first supply terminal respectively, in that the first and second transistors are of the first conductivity type and the third, fourth and fifth transistors of a second conductivity type opposite to the first conductivity type, and the base-collector junctions of the first and third transistors are short-circuited, and in that the electronic circuit further includes eighth and ninth transistors of the first conductivity type each having a base, emitter and a collector, the base, emitter and collector of the eighth transistor being connected to a second input terminal, the common junction and the current input of the second current mirror circuit respectively, the base of the ninth transistor being connected to the first control terminal, and the emitter and collector of the ninth transistor being connected to an output terminal and the first supply terminal respectively.

BRIEF DESCRIPTION OF THE DRAWINGS

The invention will be further explained with reference to the appended drawing, in which.

In these FIGURES like components have like reference characters.

DESCRIPTION OF THE PREFERRED EMBODIMENTS

Figure 1:
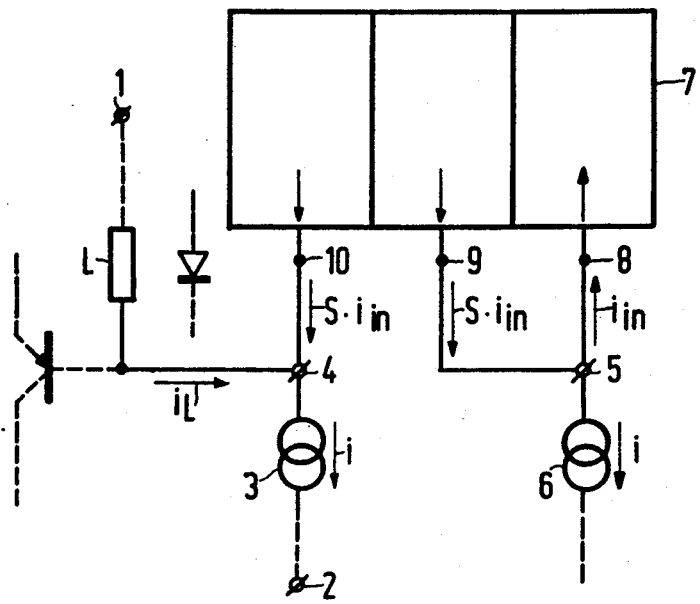
FIG. 1 shows the basic principle of an electronic circuit according to the invention.

FIG. 1 shows the basic principle of the electronic circuit according to the invention. Between a first supply terminal i and a second supply terminal 2 there is a series connection of a load L and a control current source 3. The load L and the control current source 3 are linked in a control terminal 4. The load L may be, for example, a resistor, a diode or the base of a transistor driven by the control current source 3. The current through the load L is $i_L$ and the current that the control current source can produce is i. If the current i is insufficient for the desired current $i_L$, the current i will have to be amplified in one way or another. This is possible by inserting an amplifier between the control terminal 4 and the load L. More particularly, when the frequencies of the input current i are increased, such an amplifier will cause a disturbance in the signal quality because of the introduction of an extra pole in the signal transmission from control current source 3 to load L. This disturbance may be avoided by means of the circuit according to the invention. It includes a second control terminal 5 and a second control current source 6 that produces a current equal to the current i of the first control current source 3. It further includes a current follower 7 having a current follower input 8 and a first current follower output 9 and a second current follower output 10. The current follower 7 produces at the two current follower outputs 9, 10 currents $s.i_{in}$ which are substantially equal to the current $i_{in}$ applied to the current follower input 8. The current follower input 8 and the current follower output 9 are connected, as is the second control current source 6, to the second control terminal 5. The current follower output 10 is connected to the first control terminal 4. From this configuration it may easily be calculated that:

$$i_L = i/(1-s).$$

The current flowing through the control current source 3 is therefore only a fraction of the current $i_L$ flowing through the load L. The current follower 7 and the second control current source 6 largely compensate for the current $i_L$, so that now a proportionally smaller control current i may suffice. The current i is transferred in an amplified version to the load L without interrupting the connection between the load L and the control current source.

Figure 2:
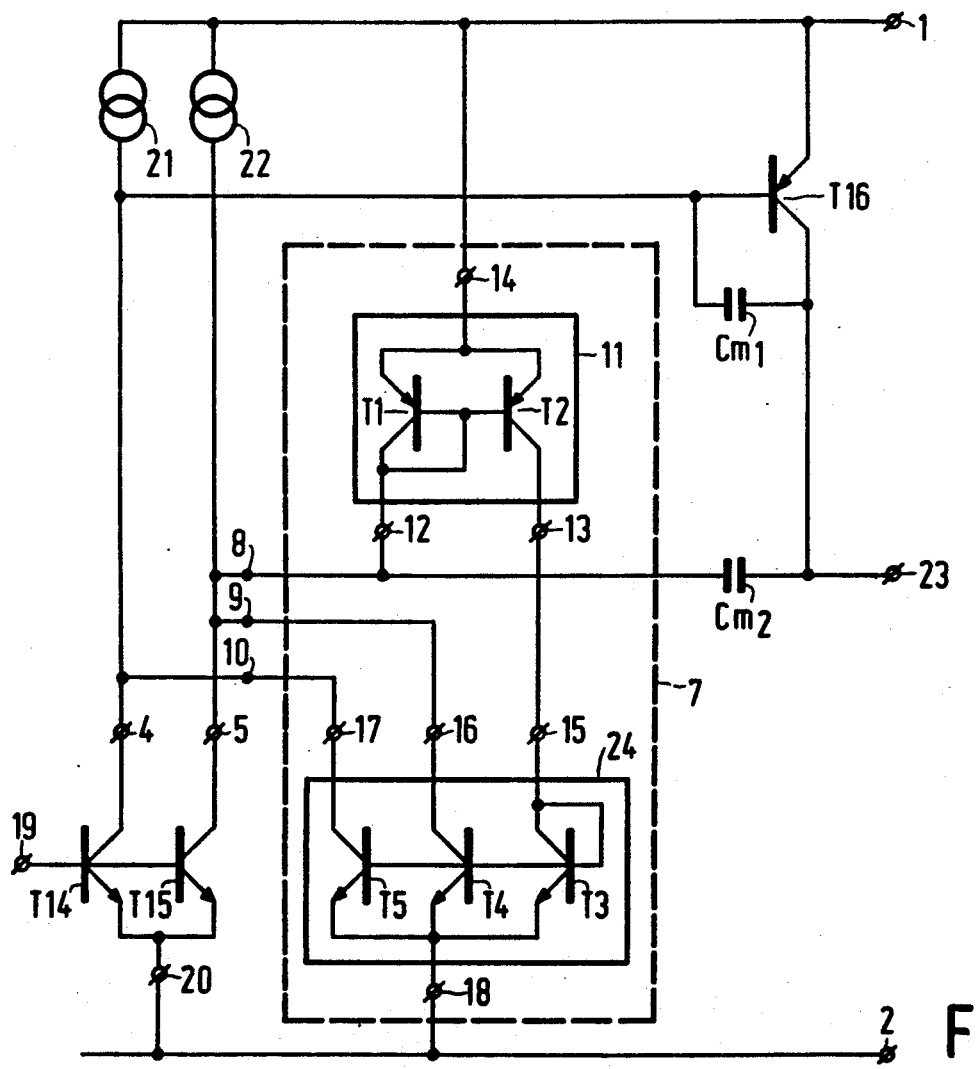
FIGS. 2 to 9 show embodiments of an electronic circuit according to the invention.

FIG. 2 shows an embodiment of an electronic circuit according to the principle represented in FIG. 1. The current follower 7 comprises a first current mirror circuit 11 having a current input 12, a current output 13 and a common current terminal 14 and includes a second current mirror circuit 24 having a current input 15, a first current output 16, a second current output 17 and a common current terminal 18. The current input 12 corresponds to the current follower input 8 and is connected to the second control terminal 5. The current outputs 16 and 17 correspond to the first current follower output 9 and the second current follower output 10 respectively, and are connected to the respective second control terminal 5 and the first control terminal 4. The current output 13 is connected to the current input 15. The common current terminals 14 and 18 are connected to, respectively, the first supply terminal 1 and the second supply terminal 2. The first current mirror circuit 11 is formed by first and second PNP transistors T1 and T2 whose collector-emitter junctions are connected between the current input 12 and current terminal 14 and between the current output 13 and current terminal 14 respectively. The base-emitter junctions of the transistors T1 and T2 are connected in parallel and are connected to the current terminal 14 on the emitter side. The base and collector of the transistor T1 are interconnected. The second current mirror circuit 24 is formed by the NPN transistors T3, T4 and T5 whose base-emitter junctions are connected in parallel and whose emitters are connected to the current terminal 18. The collectors of the third, fourth and fifth transistors T3, T4 and T5 are connected to the current input 15, the current output 16 and the current output 17 respectively, whereas the collector of transistor T3 is also connected to its base. The stacking of the thus arranged first and second current mirror circuits 11, 24 between the supply terminals 1, 2 causes a current applied to the current follower input 8 to make a current substantially equal thereto flow from the current follower outputs 9 and 10.

The first and second control current sources comprise fourteenth and fifteenth NPN transistors T14 and T15 of a first conductivity type (NPN) whose bases are connected to an input terminal 19, whose emitters are connected to a common junction 20 that is connected to the supply terminal 2 and whose collectors are connected to the first control terminal 4 and the second control terminal 5 respectively, and, in addition, to the supply terminal 1 by means of a bias current source 21 and a bias current source 22 respectively. A PNP transistor T16, of a second conductivity type (PNP) whose base is connected to control terminal 4, whose emitter is connected to the supply terminal 1 and whose collector is connected to an output terminal 23, acts as a load for the first control terminal 4.

The circuit shown in FIG. 2 may be regarded as an amplifier stage having an input 19 and an output 23 and comprising an input stage T14 which is substantially not loaded by the base of transistor T16. This circuit is suitable for low supply voltages from about 1 volt and may nevertheless be capable of producing large currents at the output terminal 23. Between the collector and the base of transistor T16 a Miller capacitor Cm1 may be introduced to render the amplifier stage suitable in a negative feedback amplifier system. In that case also the current flowing through the Miller capacitor Cm1 will be compensated for so that the desired effect of the Miller capacitor is eliminated. In order to avoid this, another Miller capacitor Cm2 is to be inserted between the collector of transistor T16 and the current follower input 8. The compensation of the Miller current component in the base current of transistor T16 is thus eliminated.

The base current for transistor T16 is supplied, in essence, by the current follower output 10. The choice of NPN transistors in the second current mirror circuit 24 makes a simple drive of the transistor T16 possible because an increasing base current is effected as a result of an increasing conduction of transistor T5. Separate d.c. current sources for quiescent current adjustment of the current mirror circuits 11, 24 are not necessary.

Figure 3:
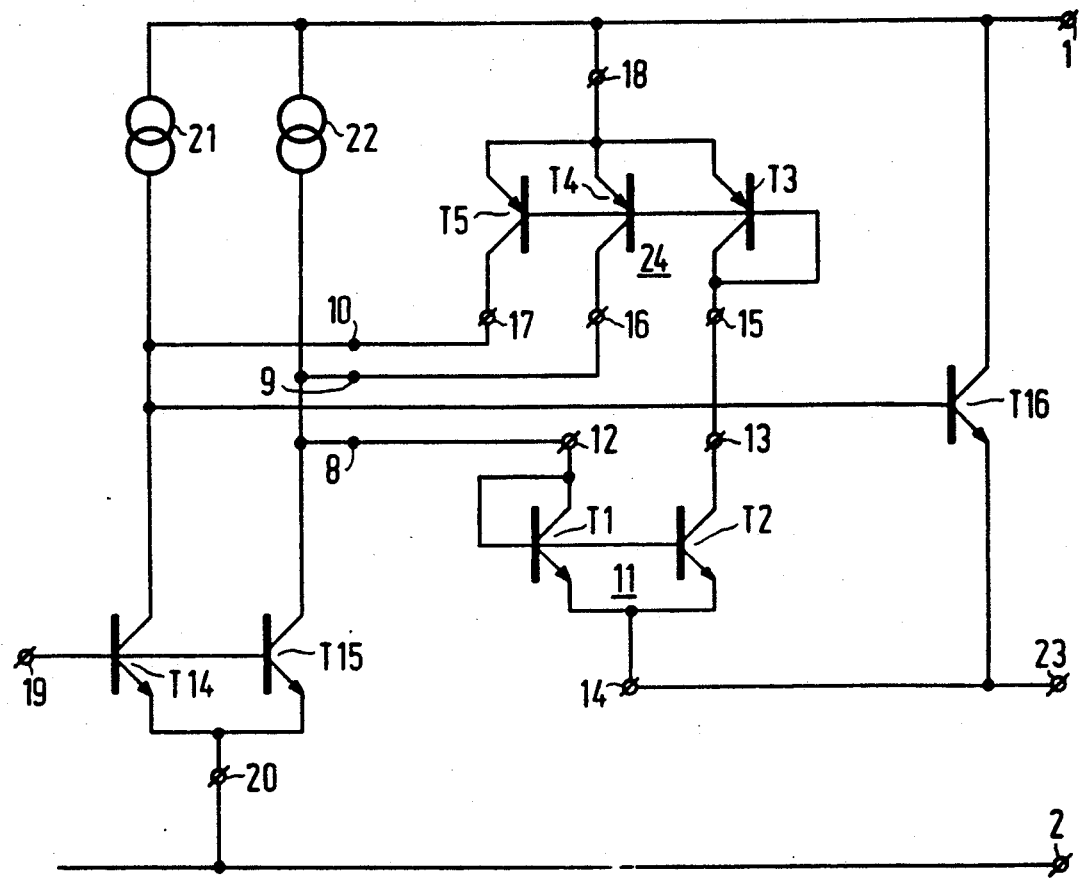

FIG. 3 shows another embodiment of an electronic circuit according to the invention. The circuit shown is essentially the same as that of FIG. 2, but the transistors of the first and second current mirror circuits now have opposite conductivity types, whereas the common current terminals 14 and 18 are now connected to the output terminal 23 and the supply terminal 1 respectively. This configuration is preferred because transistor T16 is now an NPN transistor whose collector is connected to supply terminal 1 and whose emitter is connected to output terminal 23. However, it is alternatively possible to connect current terminal 14 to supply terminal 2 in lieu of output terminal 23. Transistor T16 is arranged as an emitter follower. A configuration in which NPN transistor T16 operates in a common-emitter circuit is also possible, however. In that case the emitter of transistor T16 and current terminal 14 are to be connected to supply terminal 2 and the collector of transistor T16 is to be connected to output terminal 23. For any Miller capacitor between the collector and base of transistor T16 corrections have to be introduced in the same way as shown in FIG. 2.

Figure 4:
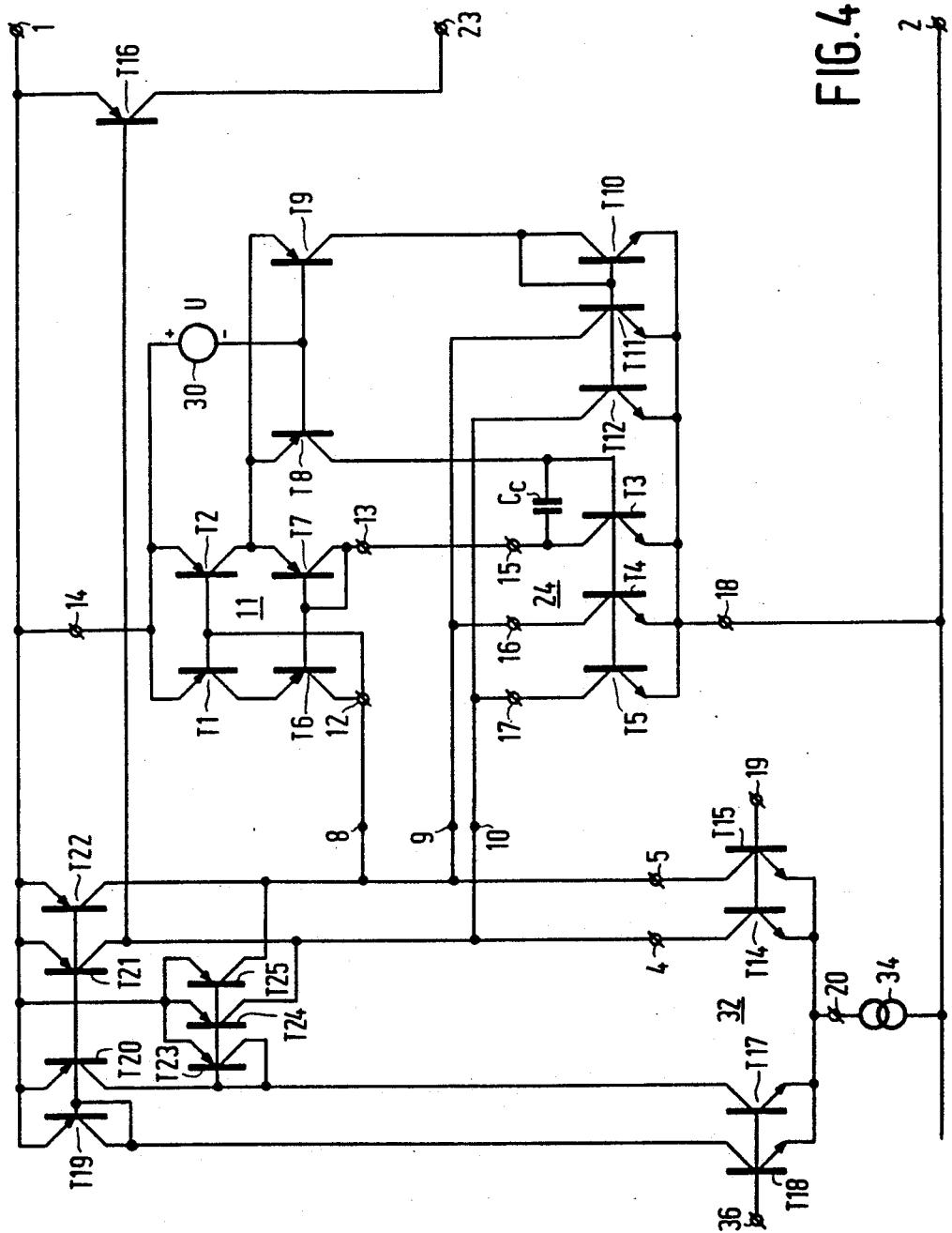

FIG. 4 shows an electronic circuit according to the invention which basically corresponds to the circuit of FIG. 2. Compared to the circuit represented in FIG. 2, two modifications are made which may also be made separately. The first modification relates to the first and second current mirror circuits (11, 24), whereas the second modification relates to a differential input stage.

In current mirror circuit 11 the collectors of first and second transistors T1 and T2 are connected via the emitter-collector junctions of sixth and seventh PNP transistors T6 and T7 to current input 12 and current output 13 respectively. The bases of transistors T6 and T7 are connected to the collector of transistor T7 which, in turn, is connected to the current output 13. The collector of transistor T6 is connected to the current input 12. The emitter of transistor T7 is further connected to the emitters of eighth and ninth PNP transistors T8 and T9 whose bases are connected to current terminal 14 via a bias voltage source 30. The collector of transistor T8 is connected to the base of transistor T3 which is now not connected to its collector as shown in FIG. 2. The collector of transistor T9 is connected to the input of a current mirror circuit comprising tenth, eleventh and twelfth NPN transistors T10, T11 and T12 arranged in a similar manner to the transistors T3, T4 and T5 respectively, in the circuit shown in FIG. 2. The emitters of transistors T10, T11 and T12 are connected to current, terminal 18 and their collectors to the collector of transistor T9, current output 16 and current output 17 respectively. The symmetry error, caused by the subtraction of the base currents of transistors T1 and T2 from the collector current of transistor T6, is now corrected by adding the base currents of the transistors T6 and T7, which are substantially equal thereto, to the collector current of transistor T7. The symmetry error caused by the base currents of the transistors T3, T4 and T5, which currents are derived from the collector current of transistor T2, is corrected by means of the transistors T8, T9, T10, T11 and T12. The transistors T11 and T12 preferably have a double emitter surface. Furthermore, the transistors in the sets of transistors T1/T2, T6/T7 and T3/T4/T5 have approximately equal base-collector voltages which reduces errors caused by the Early effect. Across the collector-base junction of transistor T3 a capacitor $C_c$ can be installed for circuit stability.

In combination with, or independent of the modifications to the current mirror circuits 11, 24, the electronic circuit of FIG. 2 can be provided with a differential input stage referenced 32 in FIG. 4. The common junction 20 is now connected via a bias current source 34 to the second supply terminal 2. The circuit further includes seventeenth and eighteenth NPN transistors T17 and T18 whose emitters are connected to junction 20 and whose bases are connected to a second input terminal 36. The collectors of the transistors T18, T17, T14 and T15 (fifteenth transistor) are connected to the collectors of nineteenth, twentieth, twenty-first, and twenty-second PNP transistors T19, T20, T21 and T22 respectively. The emitters of these four PNP transistors are connected to the first supply terminal 1 and the bases are connected to the collector of transistor T19. The transistors T19 and T21 convert the differential current from transistors T18 and T14 (fourteenth transistor) into a single-sided current. The transistors T17 and T20 are added to improve symmetry. The differential amplifier 32 also includes twenty-third, twenty-fourth and twenty-fifty PNP transistors T23, T24 and T25 whose emitters are connected to the supply terminal 1, whose bases are connected to the collector of transistor T20 and whose collectors are connected to the collectors of transistors T20, T21 and T22 respectively. In this fashion the base currents of transistors T19-T22 are also derived from transistor T23 and mirrored by the transistors T24 and T25 and added to the collector currents of transistors T21 and T22.

Figure 5:
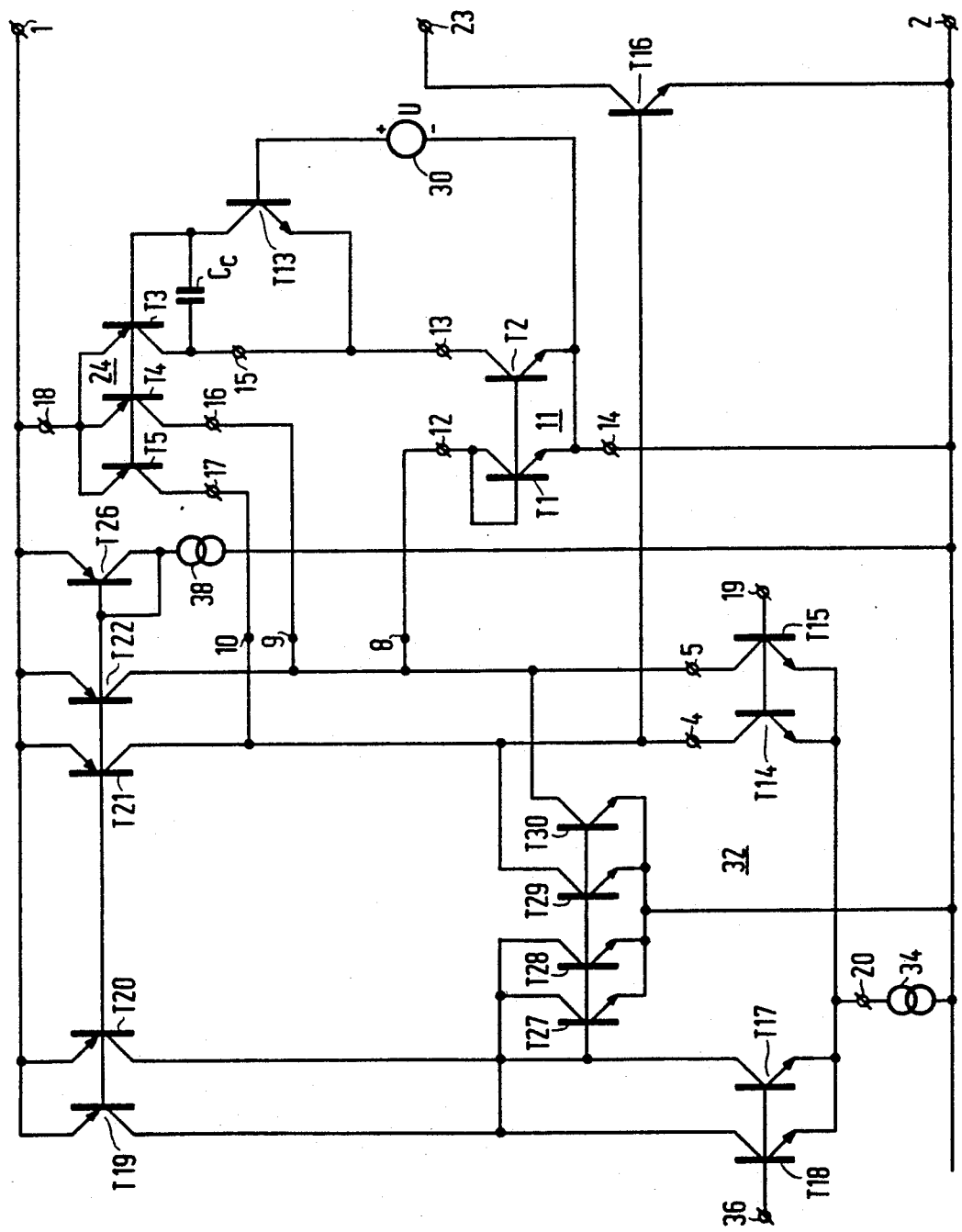

FIG. 5 shows an embodiment of an electronic circuit according to the invention resulting from modifications to the circuit shown in FIG. 3 which are similar to those of the circuit shown in FIG. 4. The transistor T16 is now represented in a common-emitter circuit in which the emitter is connected to supply terminal 2 and the collector to output terminal 23. For this reason the current terminal 14 of current mirror circuit 11 is also connected to supply terminal 2. In current mirror circuit 24 the collector-base junction of transistor T1 is not short-circuited, but is bridged by means of the emitter-collector junction of an NPN transistor T13 (thirteenth transistors) whose collector is connected to the base of transistor T3 and whose base is connected via a bias voltage source 30 to current terminal 14. Transistor T13 supplies substantially equal base-collector voltages to transistors T3-T5 and T1, T2 and reduces errors caused by the Early effect in these transistors.

Similar to the situation shown in FIG. 4, the input stage 32 has a differential arrangement comprising a current source 34, NPN transistors T18 and T17 and PNP transistors T19-T22 whose bases are not connected to the collector of transistor T19 but to the base of a twenty-sixth PNP transistor T26 arranged as a diode and whose emitter is connected to supply terminal 1 and whose collector is connected to supply terminal 2 via a (second) bias current source 38. The input stage 32 further includes NPN transistors T27-T30 whose emitters are connected to supply terminal 2, whose bases are connected to the collector of transistor T19 and whose collectors are connected to the respective collectors of transistors T18, T17, T14 and T15. The collectors of the transistors T18 and T17 are interconnected. The current mirror circuit formed by the transistors T27-T30 fixes the collector voltages of transistors T14, T15, T18 and T19 and reduces errors caused by the Early effect. The circuit represented in FIG. 5 can operate at a supply voltage of about 1 volt.

Figure 6:
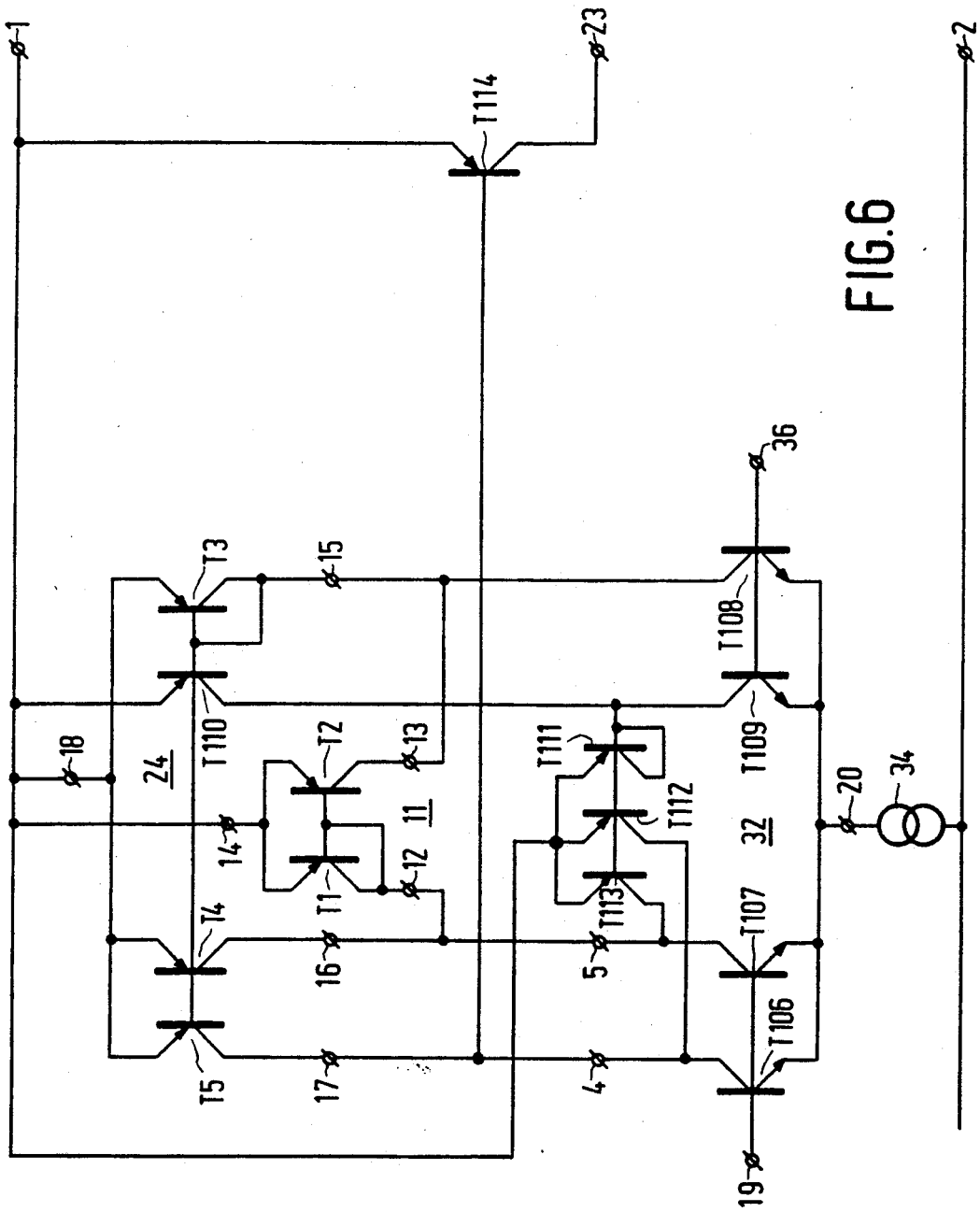

In the embodiments that have a differential input 32, the first and second current mirror circuits 11 and 24 may advantageously be combined to the current mirror circuits in the differential amplifier. FIG. 6 shows a first embodiment thereof derived from the circuit shown in FIG. 2 Compared to that circuit the following modifications have been introduced. The second current mirror circuit 24 comprises PNP transistors and is connected to the first supply terminal 1 by means of its common current terminal 18. The NPN transistors T14, T15 are replaced by sixth and seventh NPN transistors T106 and T107 and the, junction 20 is connected to the second supply terminal 2 via a bias current source 34. Furthermore, eighth and ninth NPN transistors T108 and T109 are added, whose bases are connected to a second input terminal 36, whose emitters are connected to junction 20 and whose collectors are connected to the current input 15 and the collector of a tenth PNP transistor T110 respectively. The base-emitter junction of transistor T110 is connected in parallel to that of the transistors T3-T5 of the second current mirror circuit. In addition, eleventh, twelfth and thirteenth PNP transistors T111, T112 and T113 are added, whose emitters are connected to the first supply terminal 1, their bases to the collector of transistor T109 and their collectors to the respective collectors of transistors T109, T106 and T107. The transistors T109 to T113 enhance the circuit symmetry but may be omitted as desired. A fourteenth PNP transistor T114 replaces the corresponding transistor T16 in FIG. 2. The current mirror circuit formed by the transistors T111–T113 compensates for the base currents of the transistors T3, T4, T5 and T110 flowing to the collector of transistor T108.

Figure 7:
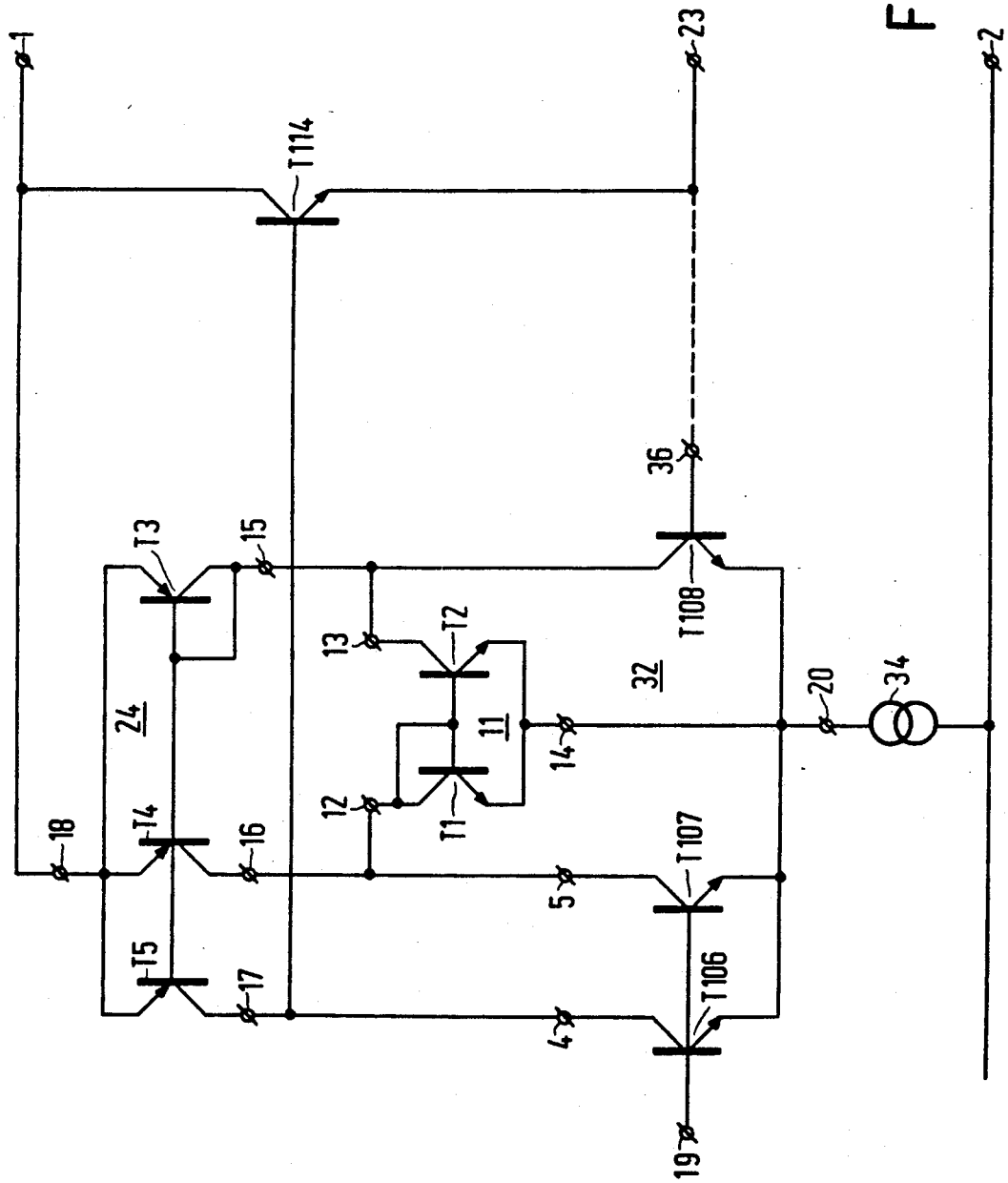

FIG. 7 represents an embodiment in which, similar to FIG. 6, the second current mirror circuit 24 is combined to that of the differential amplifier 32. The circuit may be derived from that shown in FIG. 3 with a number of modifications. The NPN transistors T14 and T15 are replaced by sixth and seventh NPN transistors T106 and T107 and junction 20 is connected to supply terminal 2 via a bias current source 34. The NPN transistor T16 is replaced by ninth NPN transistor T114. An eighth NPN transistor T108, whose emitter is connected to junction 20, whose base is connected to a second input terminal 36 and whose collector is connected to the current input 15 of the second current mirror circuit 24, is added. The common current terminal 14 of the first current mirror circuit 11 is now connected to junction 20. By connecting the output terminal 23 to the second input terminal 36, as indicated by way of a dotted line, a circuit is obtained behaving as a voltage follower from input terminal 19 to output terminal 23.

Figure 8:
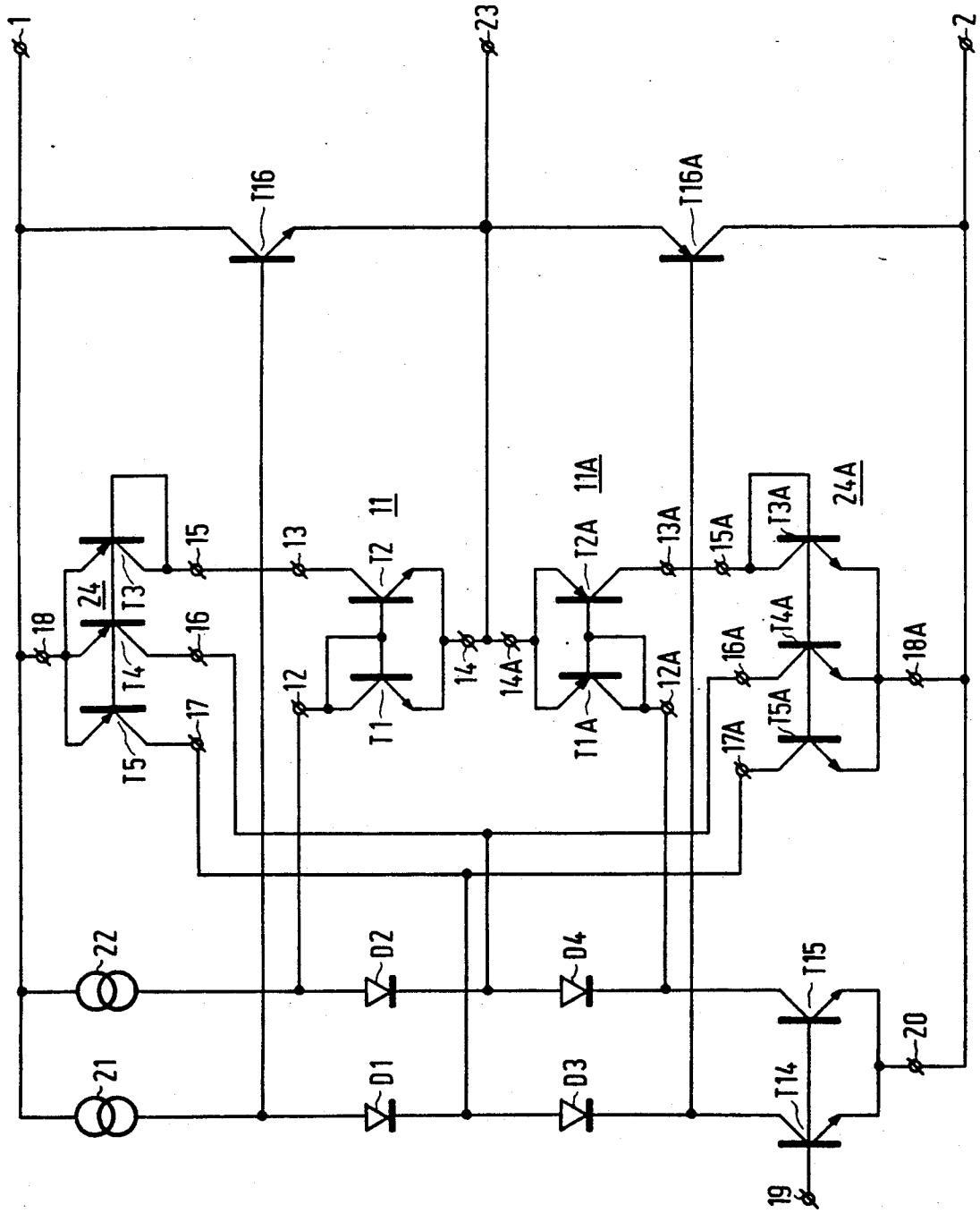

FIG. 8 shows an electronic circuit according to the invention similar to that shown in FIG. 3, but for the addition of a further transistor T16A, whose emitter is connected to output terminal 23, whose collector is connected to supply terminal 2 and whose base is connected to the collector of transistor T14, (i.e. the first control terminal). The transistor T16A is complementary to transistor T16. Other modifications are provided by current mirror circuits 11A and 24A, whose corresponding current inputs and current outputs referenced A are mutually coupled and whose common current terminals 14A and 18A respectively, are connected to the output terminal 23 and the second supply terminal 2, and which are complementary to the first and second current mirror circuits 11 and 24. The collector of transistor T14 is connected to bias current source 21 by means of two series-connected diodes D1 and D3 whose junction is connected to the current outputs 17 and 17A. The base of transistor T16 is connected to the junction of current source 21 and diode D1, the base of transistor T16A to the junction of diode D3 and the collector of transistor T14. The collector of transistor T15 is connected to bias current source 22 by means of two series-connected diodes D2 and D4. The junction of diodes D2 and D4 is connected to the current outputs 16 and 16A. The current inputs 12 and 12A are connected to the other electrode of diodes D2 and D4 where the current source 22 and the collector of transistor T15 are located. The diodes produce a bias voltage for the series-connected base-emitter junctions of the transistors T1 and T1A in the current mirror circuits 11 and 11A and of the transistors T16 and T16A.

Figure 9:
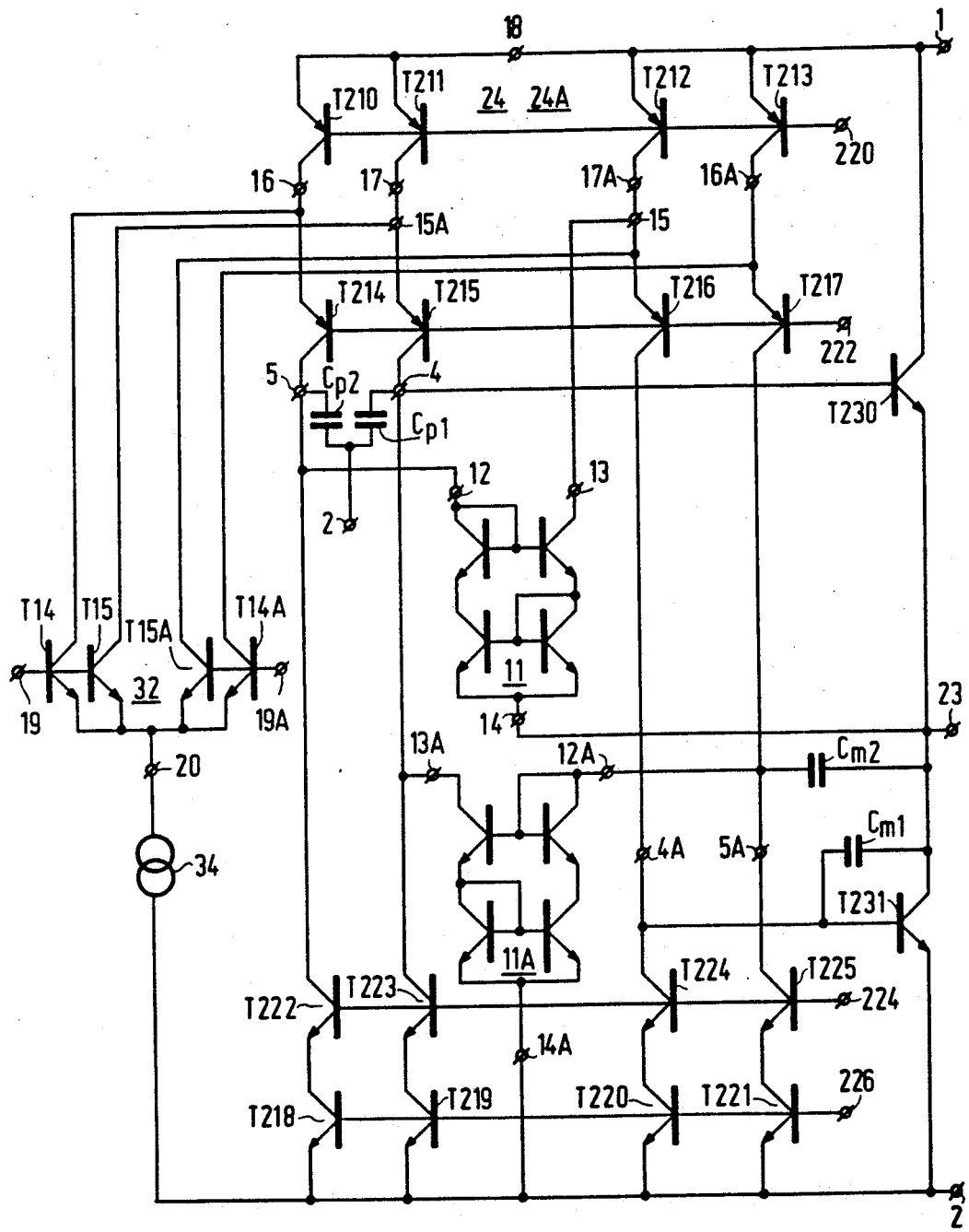

FIG. 9 shows an embodiment of an electronic circuit according to the invention, comprising a differential input stage 32 having input terminals 19 and 19A connected to the respective NPN transistors T14, T15 and the NPN transistors T14A and T15A. The emitters of these four transistors are mutually coupled to a junction 20 which is connected to the second supply terminal 2 via a bias current source 34. The collectors of the transistors T14, T15, T15A and T14A are connected to respective collectors of PNP transistors T210, T211, T212 and T213, whose bases are connected to a reference voltage terminal 220, whose emitters are connected to supply terminal 1, and whose collectors are also connected to the respective emitters of PNP transistors T214, T215, T216 and T217, whose bases are connected to a reference voltage terminal 222. The transistors T14, T15, T15A and T14A, together with the transistors T214, T215, T216 and T217 form four folded cascode connections fed from the transistors T210, T211, T212 and T213 arranged as current sources. The circuit further includes an arrangement comprising eight PNP transistors T218 to T225 coupled in a fashion similar to that of the transistors T210 to T217. The emitters of the transistors T218-T221 are connected to the supply terminal 2 and the bases to a reference voltage terminal 226. The bases of the transistors T222, T223, T224 and T225 are connected to a reference voltage terminal 224, whereas the collectors are connected to the collectors of the respective transistors T214, T215, T216 and T217 via the control terminals 5, 4, 4A and 5A respectively.

The transistors T210–T213 may be regarded as two overlapping second current mirror circuits 24 and 24A of the type shown in FIG. 3. The collector connections of these transistors may be regarded as the respective current outputs 16, 17, 17A and 16A of the current mirror circuits 24 and 24A, whereas the collectors of the transistors T211 and T212, as a result of the overlap, likewise correspond to the current inputs 15A and 15 of the current mirror circuits 24A and 24.

The circuit further includes the first current mirror circuits 11 and 11A, both comprising NPN transistors whose collector-emitter junctions are connected in series in pairs. The current inputs 12, 12A of these current mirror circuits are connected to the control terminals 5 and 5A respectively, the current outputs 13, 13A to current input 15 and control terminal 4 respectively, and the common current terminals 14, 14A to the output terminal 23 and supply terminal 2 respectively. The control terminals 4 and 4A are connected to the base of an NPN transistor T230 and an NPN transistor T231 respectively, whose collector-emitter junctions are connected to output terminal 23 and are series connected between the supply terminals 1 and 2.

The Miller capacitors Cm1 and Cm2 may be inserted, as required, between the collector of transistor T231 and the control terminals 4A and 5A, possibly in combination with stabilizing capacitors Cp1 and Cp2 between the control terminals 4 and 5 and the supply terminal 2.

The invention is not restricted to the embodiments shown. By means of combinations of and variations to the circuits shown, different embodiments are likewise possible. Furthermore, the NPN transistors may be replaced by PNP transistors and vice versa. In addition, the invention is not restricted to embodiments comprising bipolar transistors. All circuits shown may comprise unipolar transistors, for example, in CMOS technology, then substituting the gate, source and drain of the unipolar transistor for the base, emitter and collector of the bipolar transistor.

We claim:

1. An electronic circuit comprising: a series connection of a load and a first control current source coupled between first and second supply terminals for producing a first current, means connecting the load and the first control current source to a first control terminal, a second control current source for producing a second current that is substantially equal to the first current, a second control terminal connected to the second control current source and to a current follower having a current follower input for receiving a current to be followed and having first and second current follower outputs for delivering currents that are proportional to the current to be followed, the current follower input and the first current follower output being coupled to the second control terminal and the second current follower output being coupled to the first control terminal.

2. An electronic circuit as claimed in claim 1, wherein the current follower comprises first and second current mirror circuits each having a current input for a current to be mirrored and a common current terminal for connection to a supply current, the first current mirror circuit having a current output and the second current mirror circuit having first and second current outputs for delivering currents proportional to the current to be mirrored and flowing in the same direction, means coupling the current input of the first current mirror circuit to the current follower input, the current output of the first current mirror circuit being coupled to the current input of the second current mirror circuit and the first and second current outputs of the second current mirror circuit being coupled to the first and second current follower outputs, respectively.

3. An electronic circuit as claimed in claim 2, wherein the first current mirror circuit comprises first and second transistors of a same conductivity type, each having a base, an emitter and a collector, whose base-emitter junctions are connected in parallel, their emitters being connected to the common current terminal of the first current mirror circuit and their collectors being coupled to the respective current input and current output of the first current mirror circuit, and wherein the second current mirror circuit comprises third, fourth and fifth transistors of a same conductivity type, each having a base, an emitter and a collector, the base-emitter junctions of said third, fourth and fifth transistors being connected in parallel, their emitters being connected to the common current terminal of the second current mirror circuit and their collectors being coupled to the current input, the first current output and the second current output respectively, of the second current mirror circuit.

4. An electronic circuit as claimed in claim 3, wherein the bases of the first and third transistors are connected to their respective collectors and the conductivity type of the third, fourth and fifth transistors is opposite to the conductivity type of the first and second transistors.

5. An electronic circuit as claimed in claim 3, wherein the conductivity type of the third, fourth and fifth transistors is opposite to that of the first and second transistors, sixth, seventh, eighth and ninth transistors of a conductivity type the same as that of the first and second transistors, tenth, eleventh and twelfth transistors of a conductivity type the same as that of the third, fourth and fifth transistors, all having a base, emitter and a collector, wherein the collectors of the first and second transistors are connected to the emitters of the sixth and seventh transistors respectively, the bases of the sixth and seventh transistors are interconnected, the collector of the sixth transistor is connected to the base of the first transistor and to the current input of the first current mirror circuit, the collector of the seventh transistor is connected to the base of the seventh transistor and to the current output of the first current mirror circuit, the emitters of the eighth and ninth transistors are connected to the emitter of the seventh transistor, their bases to a reference voltage source, and the collector of the eighth transistor is coupled to the base of the third transistor and the collector of the ninth transistor is coupled to the collector and the base of the tenth transistor whose base-emitter junction is connected in parallel to the base-emitter junctions of the eleventh and twelfth transistors, the emitters of the tenth, eleventh and twelfth transistors are connected to the common current terminal of the second current mirror circuit, and the collectors of the respective eleventh and twelfth transistors are coupled to the respective first and second current outputs of the second current mirror circuit.

6. An electronic circuit as claimed in claim 3, wherein the electronic circuit further comprises a thirteenth transistor of a conductivity type opposite to that of the third transistor and having a base, emitter and collector connected to a reference voltage source, the collector of the third transistor and the base of the third transistor, respectively.

7. An electronic circuit as claimed in claim 5 wherein the first and second control current sources comprise fourteenth and fifteenth transistors respectively, of a first conductivity type each having a base, emitter and a collector, their bases being connected to a first input terminal and the emitters to a common junction, and the collector of the fourteenth and fifteenth transistors being coupled to the first and second control terminals, respectively.

8. An electronic circuit as claimed in claim 7 wherein the electronic circuit further comprises a sixteenth transistor having a base, emitter and a collector, whose base is connected to the first control terminal and whose main current path, formed by the emitter and the collector, is connected to an output terminal.

9. An electronic circuit as claimed in claim 8, characterized in that the sixteenth transistor is of a second conductivity type opposite to the first conductivity type, the emitter and the collector of the sixteenth transistor being coupled to the respective first supply terminal and the output terminal, in that the first and second transistors are of the second conductivity type and the third, fourth and fifth transistors are of the first conductivity type, and in that the common current terminals of the first and second current mirror circuits are connected to the first and second supply terminals, respectively.

10. An electronic circuit as claimed in claim 3 comprising a further transistor of the first conductivity type, the emitter and the collector of the further transistor being coupled to an output terminal and the first supply terminal respectively, in that the first and second transistors are of a first conductivity type and the third, fourth and fifth transistors of a second conductivity type opposite to the first conductivity type, and in that the common terminals of the first and second current mirror circuits are connected to the output terminal and the first supply terminal, respectively.

11. An electronic circuit as claimed in claim 8, characterized in that the sixteenth transistor is of the first conductivity type, the emitter and the collector of the sixteenth transistor being coupled to the second supply terminal and the output terminal respectively, in that the first and second transistors are of the first conductivity type and the third, fourth and fifth transistors of a second conductivity type opposite to the first conductivity type, and in that the common terminals, of the first and second current mirror circuits are connected to the second and first supply terminals respectively.

12. An electronic circuit as claimed in claim 9, wherein the common junction is connected to the second supply terminal.

13. An electronic circuit as claimed in claim 9 further comprising: a first bias current source coupled between the common junction and the second supply terminal, seventeenth and eighteenth transistors of the first conductivity type each having a base, emitter and a collector, whose bases are connected to a second input terminal and their emitters to the common junction; nineteenth, twentieth, twenty-first and twenty-second transistors of the second conductivity type each having a base, emitter and a collector, whose base-emitter junctions are connected in parallel and whose emitters are connected to the first supply terminal and whose collectors are coupled to the collectors of the eighteenth, seventeenth, fourteenth and fifteenth transistors, respectively.

14. An electronic circuit as claimed in claim 13, wherein the base of the nineteenth transistor is connected to the collector of the nineteenth transistor and the electronic circuit further includes twenty-third, twenty-fourth and twenty-fifth transistors of the second conductivity type, each having a base, emitter and a collector, whose base-emitter junctions are connected in parallel, whose emitters are connected to the first supply terminal and whose bases are coupled to the collector of the seventeenth transistor, and whose collectors are coupled to the collectors of the seventeenth, fourteenth and fifteenth transistors, respectively.

15. An electronic circuit as claimed in claim 13, further comprising a twenty-sixth transistor of the second conductivity type having a base, emitter and a collector, whose base-emitter junction is connected in parallel to the base-emitter junctions of the nineteenth to twenty-second transistors and whose base and collector are interconnected and coupled to the second supply terminal via a second bias current source, and twenty-seventh to thirtieth transistors of the first conductivity type each having a base, emitter and a collector, whose bases are connected to the collector of the seventeenth transistor, their emitters to the second supply terminal and whose collectors are connected to the collectors of the eighteenth, seventeenth, fourteenth and fifteenth transistors, respectively, and the collector of the eighteenth transistor being interconnected to the collector of the seventeenth transistor.

16. An electronic circuit as claimed in claim 3, characterized in that the first and second control current sources comprise sixth and seventh transistors, respectively, of a first conductivity type, each having a base, emitter and a collector, the bases being connected to a first input terminal and the emitters to a common junction, said junction being coupled to the second supply terminal via a bias current source, and the collectors of the sixth and seventh transistors being coupled to the first and second control terminals, respectively, in that the common terminals of the first and second current mirror circuits are connected to the first supply terminal, in that the first to fifth transistors are of a second conductivity type opposite to the first conductivity type and the base-collector junctions of the first and third transistors are short-circuited, and an eighth transistor of the first conductivity type having a base, emitter and a collector connected to a second input terminal, the common junction and the current input of the second current mirror circuit, respectively.

17. An electronic circuit as claimed in claim 16 further comprising: a ninth transistor of the first conductivity type and tenth to twelfth transistors of the second conductivity type, all having a base, emitter and a collector, the base and the emitter of the ninth transistor being connected to the second input terminal and the common junction, respectively, and the collector of the ninth transistor being connected to the collector of the tenth transistor, whose base-emitter junction is connected in parallel to that of the third transistor, and wherein the collector of the tenth transistor is also connected to the bases of the eleventh, twelfth and thirteenth transistors, the emitters of said eleventh, twelfth and thirteenth transistors being connected to the first supply terminal and their collectors being connected to the collector of the ninth transistor, the first control terminal and the second control terminal, respectively.

18. An electronic circuit as claimed in claim 16 further comprising a fourteenth transistor of the second conductivity type having a base, emitter and a collector, whose base is connected to the first control terminal and whose emitter and collector are coupled to the first supply terminal and an output terminal, respectively.

19. An electronic circuit as claimed in claim 3, characterized in that the first and second control current sources comprise sixth and seventh transistors respectively, of a first conductivity type, each having a base, emitter and a collector, the bases being connected to a first input terminal and the emitters to a common junction, which junction is coupled to the second supply terminal via a bias current source, and the collectors of the sixth and seventh transistors being coupled to the first and second control terminals respectively, in that the common terminals of the first and second current mirror circuits are connected to the common junction and the first supply terminal respectively, in that the first and second transistors are of the first conductivity type and the third, fourth and fifth transistors of a second conductivity type opposite to the first conductivity type, and the respective base-collector junctions of the first and third transistors are short-circuited, and eighth and ninth transistors of the first conductivity type each having a base, emitter and a collector, the base, emitter and collector of the eighth transistor being connected to a respective second input terminal, the common junction and the current input of the second current mirror circuit respectively, the base of the ninth transistor being connected to the first control terminal, and the emitter and collector of the ninth transistor being connected to an output terminal and the first supply terminal, respectively.

20. An electronic circuit as claimed in claim 10, comprising a second further transistor complementary to the further transistor and having a base, emitter and a collector coupled to the first control terminal, the output terminal and the second supply terminal, respectively, a first current mirror circuit complementary to the first current mirror circuit and a second current mirror circuit complementary to the second current mirror circuit, corresponding current inputs and current outputs of the current mirror circuits being mutually coupled, the common current terminal of the complementary first current mirror circuit being connected to the output terminal and the common current terminal of the complementary second current mirror circuit being connected to the second supply terminal, and means connecting a common junction of the first and second control current sources to the second supply terminal.

21. An electronic circuit as claimed in claim 9, wherein a Miller capacitor is connected to the base and collector of the sixteenth transistor, and a further Miller capacitor coupled between the collector of the sixteenth transistor and the second control terminal.

22. An electronic circuit as claimed in claim 18, wherein a Miller capacitor is connected to the base and collector of the fourteenth transistor, and a further Miller capacitor coupled between the collector of the fourteenth transistor and the second control terminal.

23. An electronic circuit as claimed in claim 3 wherein bipolar transistors having a base, emitter and a collector are replaced by unipolar transistors having a gate, source and a drain, respectively.

24. An electronic circuit as claimed in claim 1 wherein, the first and second control current sources comprise first and second transistors respectively, of a first conductivity type, each having a base, emitter and a collector, their bases being connected to a first input terminal and the emitters to a common junction, and the collectors of the first and second transistors being coupled to the first and second control terminals, respectively.

25. An electronic circuit as claimed in claim 3 wherein, the first and second control current sources comprise sixth and seventh transistors respectively, of a first conductivity type, each having a base, emitter and a collector, their bases being connected to a first input terminal and the emitters to a common junction, and the collectors of the sixth and seventh transistors being coupled to the first and second control terminals, respectively.

26. An electronic circuit as claimed in claim 1 wherein the electronic circuit further comprises a transistor having a base, emitter and a collector, whose base is connected to the first control terminal and whose main current path, formed by the emitter and the collector, is connected to an output terminal.

27. An electronic circuit as claimed in claim 8 further comprising: a first bias current source coupled between the common junction and the second supply terminal, seventeenth and eighteenth transistors of the first conductivity type each having a base, emitter and a collector, whose bases are connected to a second input terminal and their emitters to the common junction; nineteenth, twentieth, twenty-first and twenty-second transistors of the second conductivity type each having a base, emitter and a collector, whose base-emitter junctions are connected in parallel and whose emitters are connected to the first supply terminal and whose collectors are coupled to the collectors of the eighteenth, seventeenth, fourteenth and fifteenth transistors, respectively.

28. An electronic circuit as claimed in claim 11 further comprising: a first bias current source coupled between the common junction and the second supply terminal, seventeenth and eighteenth transistors of the first conductivity type each having a base, emitter and a collector, whose bases are connected to a second input terminal and their emitters to the common junction; nineteenth, twentieth, twenty-first and twenty-second transistors of the second conductivity type each having a base, emitter and a collector, whose base-emitter junctions are connected in parallel and whose emitters are connected to the first supply terminal and whose collectors are coupled to the collectors of the eighteenth, seventeenth, fourteenth and fifteenth transistors, respectively.

29. An electronic circuit as claimed in claim 17 further comprising: a fourteenth transistor of the second conductivity type having a base, emitter and a collector, whose base is connected to the first control terminal and whose emitter and collector are coupled to the first supply terminal and an output terminal, respectively.

30. An electronic circuit as claimed in claim 10 wherein a Miller capacitor is connected to the base and collector of the further transistor, and a further Miller capacitor coupled between the collector of the further transistor and the second control terminal.

* * * * *